United States Patent
Anthony et al.

(10) Patent No.: US 7,154,134 B2
(45) Date of Patent: Dec. 26, 2006

(54) ADJUSTABLE CCD CHARGE SPLITTER

(75) Inventors: Michael P. Anthony, Andover, MA (US); Edward J. Kohler, Waltham, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 5 days.

(21) Appl. No.: 11/177,153

(22) Filed: Jul. 6, 2005

(65) Prior Publication Data
US 2006/0170002 A1 Aug. 3, 2006

Related U.S. Application Data

(60) Provisional application No. 60/585,893, filed on Jul. 7, 2004.

(51) Int. Cl.
*H01L 29/765* (2006.01)
(52) U.S. Cl. ............ 257/238; 257/241; 438/144
(58) Field of Classification Search ............ 257/238, 257/240, 241; 438/144, 145, 147
See application file for complete search history.

(56) References Cited

U.S. PATENT DOCUMENTS

| | | | |
|---|---|---|---|
| 4,206,446 A * | 6/1980 | Rockett, Jr. ............ 341/172 |
| 4,541,068 A * | 9/1985 | Tower ............ 708/819 |
| 5,132,656 A | 7/1992 | Munroe |
| 5,671,252 A | 9/1997 | Kovacs et al. |
| 5,708,282 A | 1/1998 | Linnenbrink et al. |
| 6,885,827 B1 * | 4/2005 | Shushakov et al. ......... 398/202 |

OTHER PUBLICATIONS

Bencuya et al.; "Dynamic Packet Splitting in Charge Domain Devices;" IEEE Electron Device Letters, vol. EDL-3, No. 9; Sep. 1982; ISSN 0193-8576; 5 sheets.

Munroe et al.; 2-um, 1.6-mW Gated-Gm Sampler with 72-dB SFDR for fs = 160 Ms/s and fin = 320.25 MHz; IEEE Journal of Solid-State Circuits, vol. 33, No. 3; Mar. 1998; pp. 400-409.

* cited by examiner

Primary Examiner—T. N. Quach
(74) Attorney, Agent, or Firm—Daly, Crowley, Mofford & Durkee, LLP (57) ABSTRACT

An adjustable charge coupled device (CCD) charge splitter includes a channel control structure and an associated plurality of output channels. Control signals applied to the channel control structure determine an amount of charge, which passes into each one of the plurality of output channels.

32 Claims, 5 Drawing Sheets

ADJUSTABLE CCD CHARGE SPLITTER

CROSS-REFERENCE TO RELATED APPLICATIONS

This application claims the benefit under 35 U.S.C. §119 (e) of provisional application No. 60/585,893 filed Jul. 7, 2004 which application is hereby incorporated herein by reference in its entirety.

STATEMENTS REGARDING FEDERALLY SPONSORED RESEARCH

This invention was made with government support under Contract No. F19628-00-C-0002 awarded by the Air Force. The government has certain rights in the invention.

FIELD OF THE INVENTION

This invention relates to charge splitting devices and more particularly to charge splitting using charge coupled devices (CCDs).

BACKGROUND OF THE INVENTION

Charge Coupled Devices (CCDs) provide a basic function of storing and moving isolated packets of electrical charge. Various operations can be performed on the charge packets. For example, multiple packets can be added together (merged), single packets may be split into two or more pieces, conditionally steered, destructively or nondestructively sensed, and the like. These operations make it possible to use CCD based circuits for various discreet time analog signal processing operations, by having signals represented as charge packets.

The present invention relates to charge splitting devices and more particularly to a Charge Coupled Device (CCD) structure in which an incoming charge packet is split into multiple outgoing charge packets.

As is known in the art, a charge coupled device (CCD) charge splitter is a CCD structure in which a single incoming charge packet is split into two or more outgoing packets. The splitting ratio, i.e., the ratio of the outgoing packets, is a design parameter of the structure.

One known type of charge splitter uses a series of storage and barrier gates. The input charge to be split is first fed to a "splitting" storage gate. The splitting gate provides a structure in which the incoming charge packet is temporarily stored and partitioned into the two or more outgoing electrical packets. Then, when the packets are allowed to spill over the outgoing barrier gate, each is collected and stored in a separate output storage gate. The ratio of the split is fixed by the geometry of the channel underneath the splitting gate. The splitting process depends upon both the initial distribution of charge under the splitting gate, and the charge outflow rate from the splitting gate to the respective output storage gates.

The splitting ratio in known types of charge splitters is fixed by the design, but is subject to variations in implementation. These variations occur for multiple reasons, but may be due to Integrated Circuit (IC) process variations (such as differences in photo masking processes, gate threshold levels, and the like) as well as operating conditions (such as supply voltage, temperature, external noise sources, and the like).

SUMMARY OF THE INVENTION

In view of the above-described splitting ratio variability in existing types of charge splitters, it would be desirable to provide means to adjust the splitting ratio during circuit operation.

In accordance with the present invention, a charge coupled device (CCD) charge splitter includes an input channel and a plurality of output channels coupled to the input channel. The charge splitter also includes a channel control structure disposed over at least a portion of the input channel and a portion of at least two of the plurality of output channels. The channel control structure is adapted to adjust respective amounts of charge flowing into the plurality of output channels in response to a control signal.

In accordance with a further aspect of the present invention, a method of splitting charge in a charge coupled device (CCD), which has an input channel, a plurality of output channels, and a channel control structure disposed over at least a portion of the input channel and a portion of at least two of the plurality of output channels includes receiving a charge at the input channel. The method also includes transferring the charge to the channel control structure and applying one or more control signals to the channel control structure. The channel control structure is adapted to adjust respective amounts of charge flowing into the plurality of output channels in response to the one or more control signals.

In accordance with a still further aspect of the present invention, a charge splitting apparatus for splitting an input charge in a charge coupled device (CCD) includes a channel coupled to receive and carry the input charge through the CCD. The charge splitting apparatus also includes a first and a second charge collection structure, and a controller for controlling a split of the input charge so that portions of the input charge are fed, respectively, to the first and second charge collection structures.

In accordance with a still further aspect of the present invention, a charge coupled device (CCD) apparatus for dividing an input charge packet into a plurality of output charge packets includes a receiver, coupled to receive and carry input charge packets through the apparatus. The apparatus also includes at least two charge collection structures and a controller, responsive to an input signal, for controlling portions of the input charge that are fed to each of the charge collection structures, in accordance with parameters of input signals.

BRIEF DESCRIPTION OF THE DRAWINGS

The foregoing features of this invention, as well as the invention itself, may be more fully understood from the following description of the drawings in which.

DETAILED DESCRIPTION OF THE INVENTION

In the following description of an adjustable charge coupled device (CCD) charge splitter, the use of "4-phase" CCD technology, with two general types of gates, is assumed. These two types of gates are so-called "storage gates" and so-called "barrier gates." Storage gates are gates under which electrical charge packets reside for appreciable periods of time. Barrier gates are gates under which electrical charges pass dynamically but are not generally stored. It should be appreciated, of course, that technology other than "4 phase" CCD technology may also be used.

Storage and barrier gates may be constructed in two separate layers of gate material, and can overlap. Alternatively, storage and barrier gates may be constructed in a single layer of gate material without overlap. Other techniques may also be used to construct CCD gates. It should thus be appreciated that the concepts described and claimed herein are not limited to a particular type of CCD technology or to particular manufacturing techniques.

Figure 1:
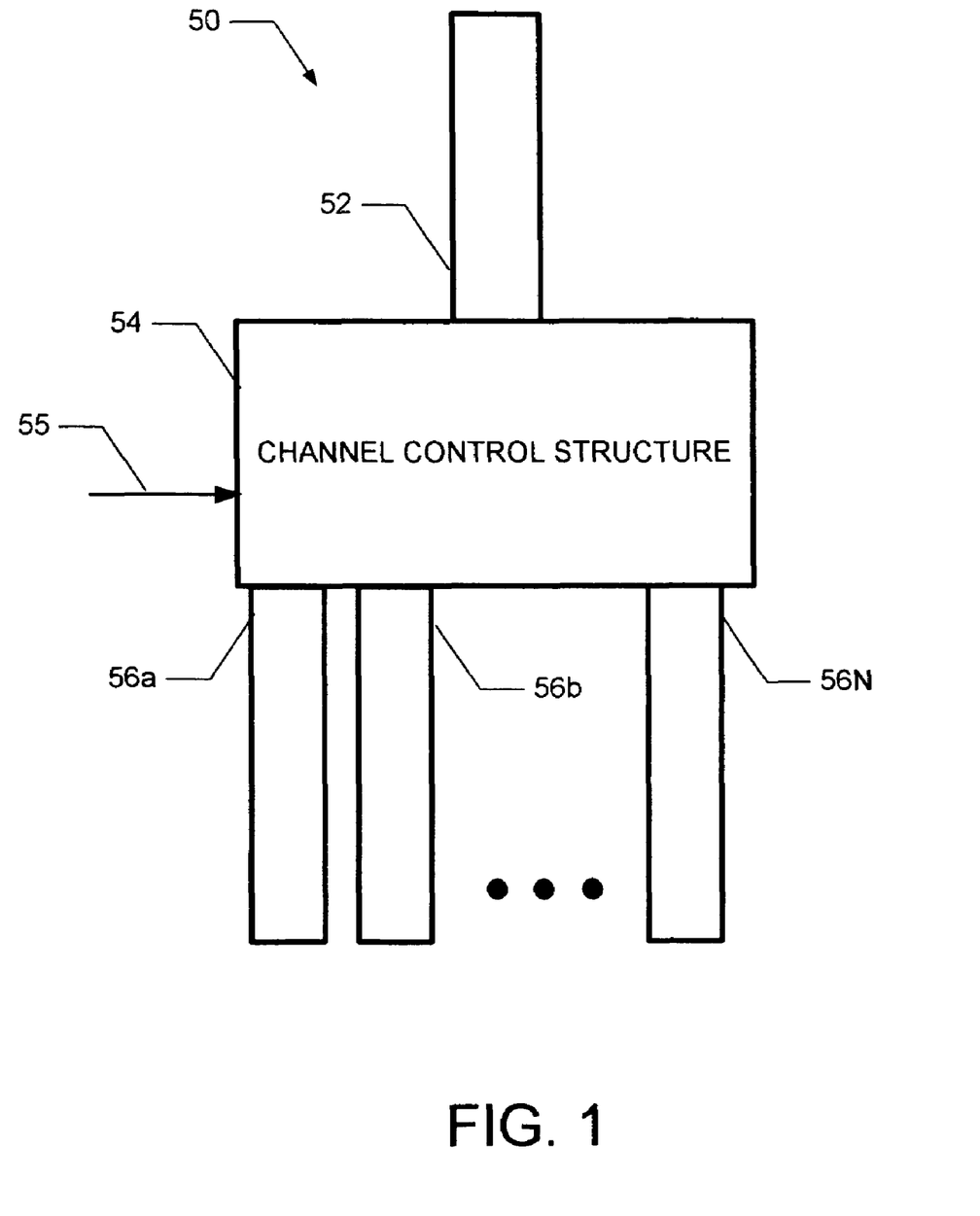
FIG. 1 is a block diagram of an adjustable charge coupled device (CCD) charge splitter having a channel control structure.

Referring now to FIG. 1, a charge coupled device (CCD) apparatus 50 for dividing an input charge packet into a plurality of output charge packets (also sometimes referred to herein as an adjustable CCD charge splitter or more simply as an adjustable charge splitter), includes an input channel 52, a channel control structure 54 (sometimes referred to herein simply as a controller) and a plurality of output channels 56a–56N.

The controller 54 is responsive to one or more input signals 55 (also referred to herein as control signals), and controls portions of the input charge that are fed to each of the N output channels 56a–56N in accordance with parameters of the control signals 55. Details of exemplary controller embodiments and exemplary control signals are provided herein below. In general, however, the controller 54 functions so as to divide the input charge into N smaller output charges. Further, the controller 54 is designed such that it may change the proportion of the input charge that is fed to each of the output channels 54a–54N in response to the one or more control signals 55.

It should be appreciated that the output channels 56a–56N need not all be provided having the same dimensions. For example, some output channels may be provided having a width, which is different from the width of other output channels (e.g. wider or narrower), some output channels may be provided having a length, which is different than the length of other output channels (e.g. shorter or longer) and some output channels may be provided having a shape, which is different than the shape of other output channels. The particular size, shape, and dimensions of each output channel depend upon a variety of factors including but not limited to the particular application in which the CCD charge splitter is being used. Those of ordinary skill in the art will appreciate how to select the number of output channels as well as the particular size shape and dimensions for each output channel depending upon the particular application.

Two exemplary embodiments of channel control structures are described below in conjunction with FIGS. 2 and 3. However, suffice it here to say that the channel control structure corresponds to any structure, which can receive an input charge and which can adjust amounts of the input charge provided to the output channels 56a–56N as the charge moves toward the output channels. Thus, channel control structure 54 can be provided as any structure which can be used to adjustably apportion the input charge between the output channels 56a–56N.

In operation, the adjustable charge splitter 50 receives an input charge at the input channel 52. The channel control structure 54 operates to split the input charge into portions and provides the charge portions to the output channels 56a–56N. The amounts of charge provided to the output channels 56a–56N can be any equal or unequal portions of the input charge presented at the input channel 50.

In some embodiments, it may be desirable to provide a charge splitter in which substantially the same amount of charge is provided to each of the output channels 56a–56N. It should be recognized, however, that because the adjustable charge splitter 50 is fabricated utilizing integrated circuit processing techniques which result in imperfect circuits, the adjustable charge splitter 50 can have structural variations, which cause the amounts of charge provided to the output channels 56a–56N to be unequal. Furthermore, as described above, other factors (e.g. variations in supply voltage, temperature, as well as external noise sources) can also cause the amounts of charge provided to the output channels 56a–56N to be unequal. To compensate for these effects, the input control signals 55 to the charge splitter 50 can be altered, thus adjusting the charges provided to the several output channels 56a–56N. With this arrangement, the channel control structure 54 can be adjusted to provide substantially equal amounts of charge at output channels 56a–56N despite the error sources described above.

In some other embodiments, it may be desirable to provide a charge splitter in which different amounts of charge are provided to one or more of the output channels 56a–56N. In these embodiments, it may be desirable to provide particular desired amounts of charge to one or more of the output channels 56a–56N. For reasons similar to those described above, various effects can tend to cause a difference between the particular desired amounts of charge and the actual amounts of charge provided at the output channels 56a–56N. However, in a way similar to that described above, to compensate for these effects, the input control signals 55 to the charge splitter 50 can be altered, thus adjusting the charges provided to the several output channels 56a–56N. With this arrangement, the channel control structure 54 can be adjusted to provide the particular desired amounts of charge at output channels 56a–56N.

Figure 2:
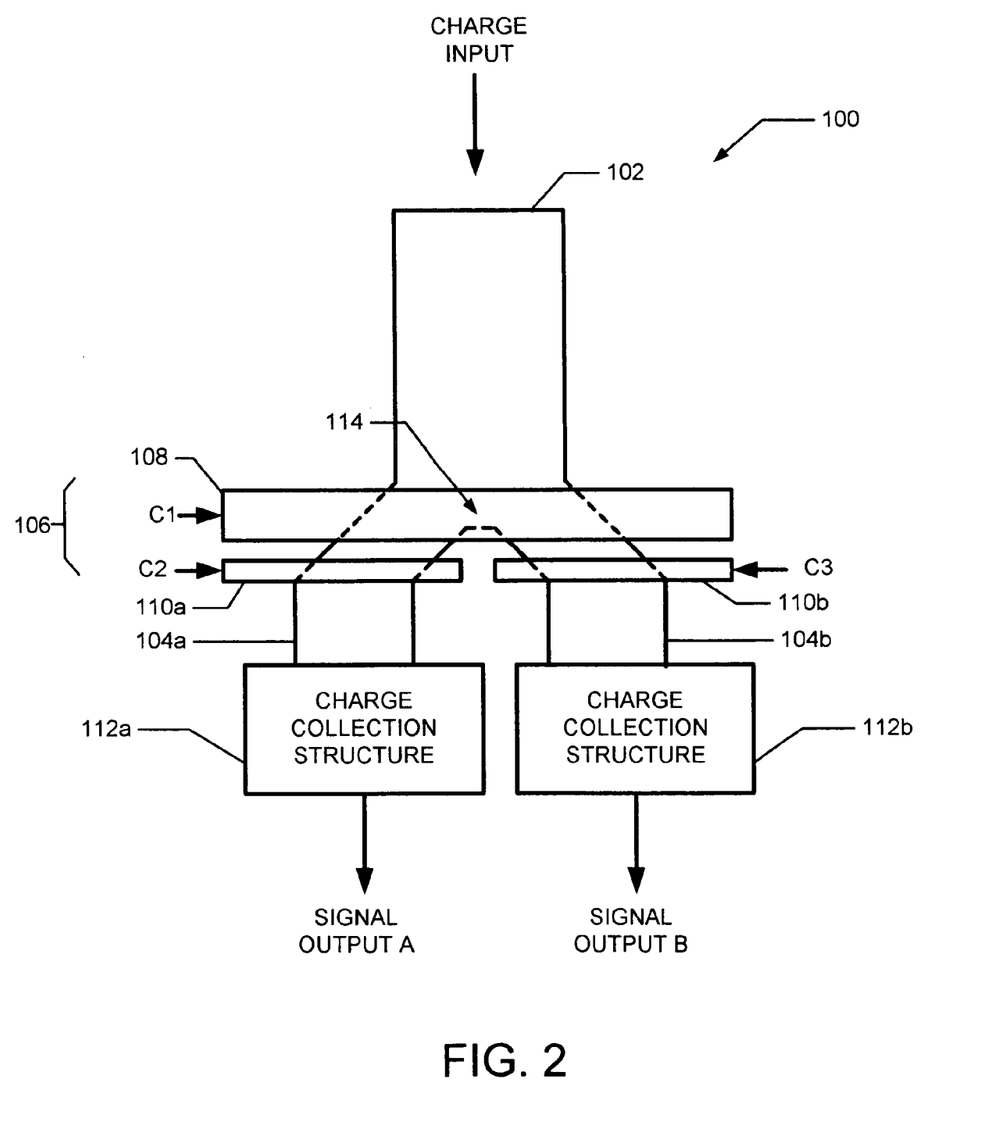
FIG. 2 is another block diagram of an adjustable charge coupled device (CCD) charge splitter having two charge collection structures, and in which further details of the channel control structure of FIG. 1 are shown.

Referring now to FIG. 2, an adjustable charge splitter 100 includes an input channel 102, and first and second output channels 104a, 104b, respectively. The input channel 102 may be the same as or similar to the input channel 52 of FIG. 1 and the output channels 104a, 104b may be the same as or similar to the plurality of output channels 56a–56N of FIG. 1.

Disposed over a portion of the input channel 102 and the output channels 104a, 104b is a channel control structure 106. The channel control structure 106 provides the same or similar functions as the channel control structure 54 described above in conjunction with FIG. 1. In this particular embodiment, the channel control structure 106 is provided from a storage/splitting gate 108 and first and second barrier gates 110a, 110b each of which receive respective ones of control signals C1–C3 as shown. The control structure 106 is responsive to the control signals in a manner to be described below.

The first output channel 104a has associated therewith a first charge collection structure 112a (also referred to as a charge-packet collection structure), and the second output channel 104b has associated therewith a second charge collection structure 112b.

The charge collection structures 112a, 112b may be provided as gates (e.g. storage, barrier or splitting gates) or as diffusions. It should also be appreciated that the charge collection structures 112a, 112b need not be identical. That is, one charge collection structure may be provided as a gate and the other as a diffusion. Alternatively, the charge collection structures 112a, 112b may be provided as different types of gates (i.e. a different type of gate on each output channel) or as different types of diffusions (i.e. diffusions serving any one of many CCD functions on each output channel).

In operation, the adjustable charge splitter 100 receives an input charge at the input channel 102 and the charge is stored under storage/splitting gate 108. Control signals C1, C2, and C3 are applied to gates 108, 110a, and 110b. The potential of signals C2 and C3 govern the conductance of the CCD channels leading out of the storage/splitting gate 108 and into the output channels 104a and 104b in much the same way as a differential pair of transistors can 'steer' current in an analog circuit. In particular, when the conductance of the channel controlled by the gate 110a and governed by the control signal C2 increases relative to the conductance of the channel controlled by the gate 110b and governed by the control signal C3, a larger charge flow (current) will be induced through the channel governed by the gate 110a. Thus, a larger fraction of the initial charge stored in the gate 108 will be transferred to the output channel 104a relative to 104b, and thence to charge collection structure 112a relative to 112b. By controlling the channel conductance to split the charge, the splitting ratio of the charge splitter 100 can be modulated via the control signals C2, C3.

Accordingly, application of control signals C1, C2 and C3 to gates 108, 110a and 110b moves charge from the storage/splitting gate 108 to the output channels 104a, 104b. In particular, charge stored under the storage/splitting gate 108 is split into two outgoing charge packets as it exits this gate and a controlled portion of the total charge, in response to the control signals, is provided to each of the output channels 104a, 104b through the channels controlled by gates 110a, 110b. Thus, application of the control signals C1–C3 to the gates 108, 110a and 110b results in a split of the input charge among the output channels 104a, 104b which lead to the charge collection structures 112a, 112b.

The first charge collection structure 112a provides a 'signal output A', and the second charge collection structure 112b provides a 'signal output B'. In some embodiments, signal output A and signal output B may be the respective portions of charge provided to output channels 104a and 104b by the charge control structure 106. In other embodiments, signal output A and signal output B may correspond to voltage signals having voltage values proportional to charges provided respectively to the first and second output channels 104a, 104b by the charge control structure 106.

It should be appreciated that the input channel 102 and the output channels 104a, 104b are disposed in a substantially Y-shaped arrangement. However, the input and output channels can be disposed such that they form other shapes including but not limited to a T-shape. It should also be appreciated that channels 104a, 104b begin to diverge from each other at a region 114 and that the geometry of the region 114 may take on many different shapes. For example, the channels 104a, 104b may meet at region 114 and form a corner having an acute angle, a right angle, or an obtuse angle. In still other embodiments, the channels 104a, 104b may meet at region 114 and form a curved or rounded corner.

Figure 3:
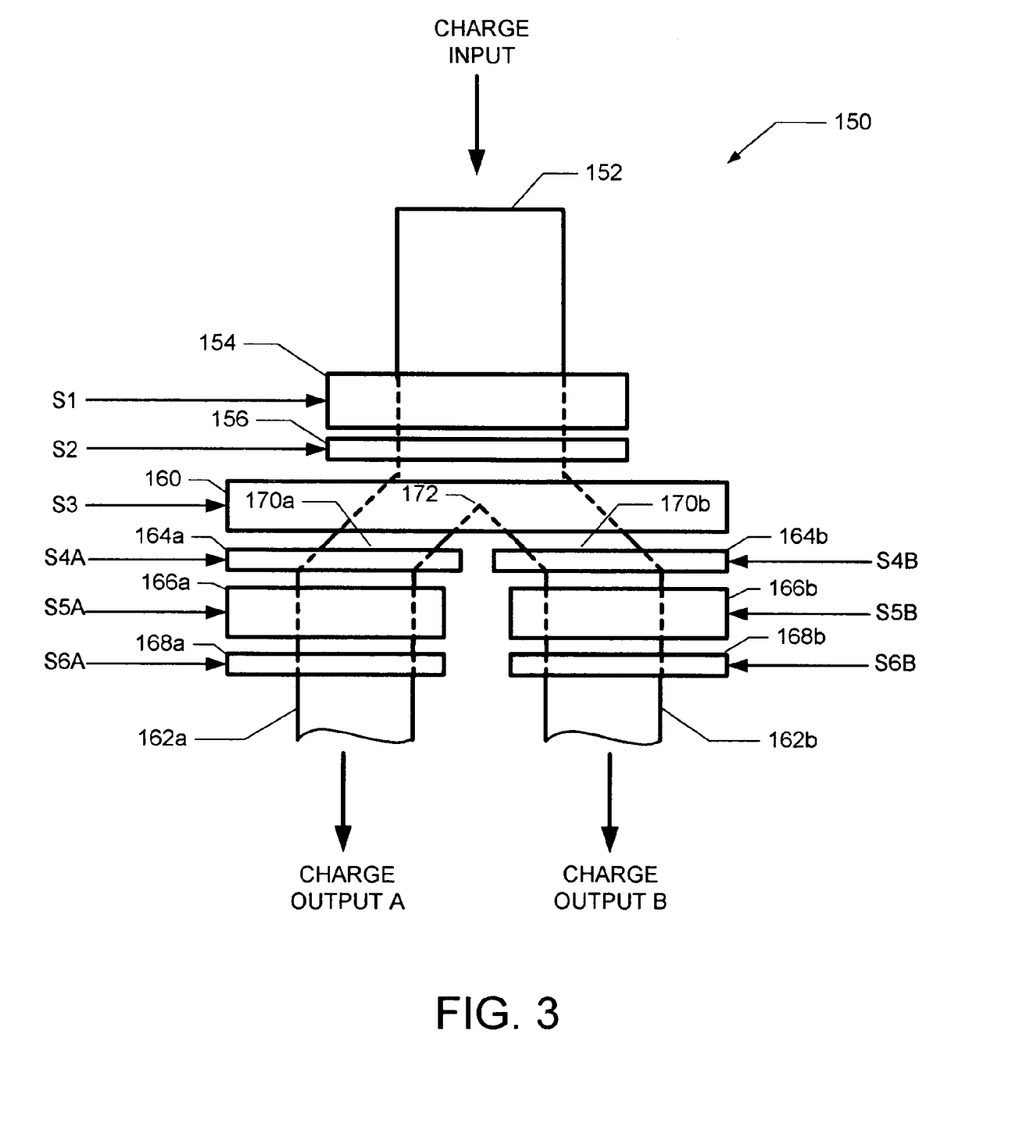
FIG. 3 is another block diagram of an adjustable charge coupled device (CCD) charge splitter in which further details of the channel control structure and the charge collection structures of FIG. 2 are shown.

Referring now to FIG. 3, an adjustable charge splitter 150 includes an input channel 152 at which an input charge is received, an input storage gate 154, an input barrier gate 156, and a storage/splitting gate 160, which leads to first and second output channels 162a, 162b, respectively. The adjustable charge splitter 150 also includes first and second barrier gates 164a, 164b, first and second charge-collection-structure storage gates 166a, 166b and first and second charge-collection structure barrier gates 168a, 168b. Gates 166a, 168a, and 166b, 168b are examples of charge collection structures discussed above in conjunction with FIG. 2. Output charges are provided at the output channels 162a, 162b.

In operation, an electrical charge is received at input channel 152 and stored under the input storage gate 154. Control signals S1, S2, and S3 are respectively applied to gates 154, 156 and 160 as shown below in FIGS. 4–4B, to move charge from the input storage gate 154, through the input barrier gate 156, and to the storage/splitting gate 160. The charge stored under the storage/splitting gate 160 is split into two outgoing charge packets as it exits this gate.

In exiting the storage/splitting gate 160, the charge packets pass through the channel beneath the first and second barrier gates 164a, 164b, respectively, which govern charge outflow from the storage/splitting gate 160. The first and second barrier gates 164a, 164b are driven by separate control signals S4A and S4B. In some embodiments, the control signals S4A and S4B each have two voltage states.

Figure 4:
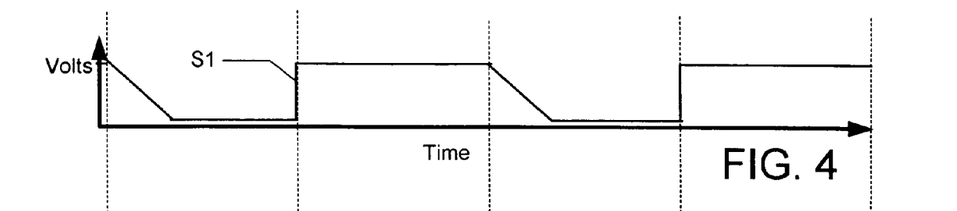
FIGS. 4–4E are a series of charts showing waveforms which are used to control the adjustable charge coupled device (CCD) charge splitter of FIG. 3.
Figure 4A:
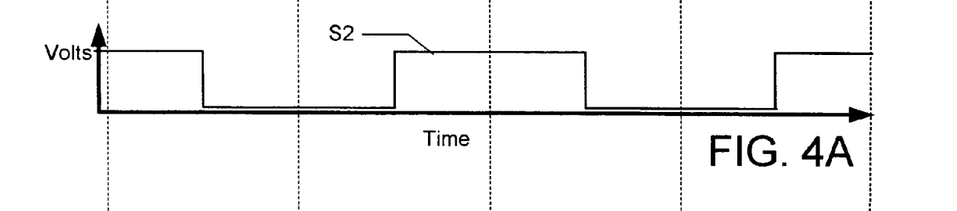
Figure 4B:
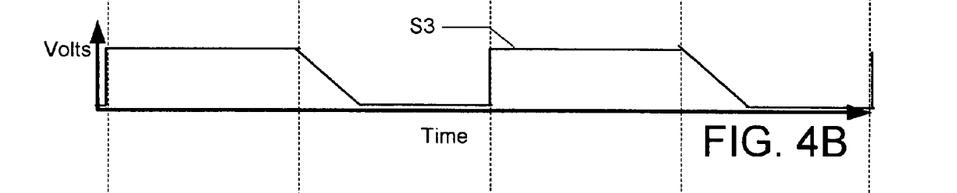
Figure 4C:
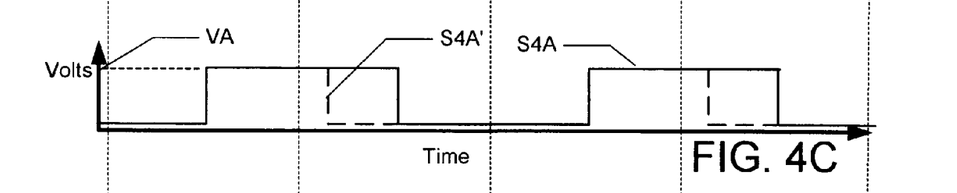
Figure 4D:
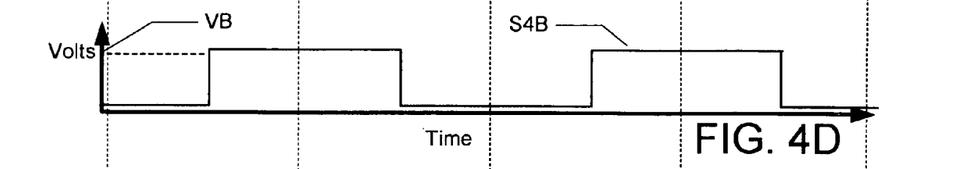

In particular, in some embodiments, the voltages of the control signals S4A and S4B applied to first and second barrier gates 164a, 164b (as shown in FIGS. 4C, 4D) govern the conductance of the regions 170a, 170b leading out of the storage/splitting gate 160 and into respective ones of the first and second charge-collection-structure storage gates 166a, 166b, respectively.

The barrier gates 164a, 164b governing charge outflow from the storage/splitting gate 160 are driven by separate clocks, identified here as S4A and S4B. The respective voltages of these two clocks during the charge transfer can affect the outflow rates from the splitting gate to the respective output storage gates. Splitter adjustment with this arrangement is accomplished by adjusting the voltage difference between the control signals S4A and S4B. In these embodiments, the voltage of the control signals S4A and S4B is a "characteristic" of the control signals, the value of which can be varied (i.e., the voltage of the control signal S4A can be different than the voltage of the control Signal S4B) to control amounts of charge, which flow into the first and second charge-collection-structure storage gates 166a, 166b, respectively.

When the conductance of the channel governed by the first barrier gate 164a and the associated signal S4A is increased relative to the conductance of the channel governed by the second barrier gate 164b and the control signal S4B, a larger amount of charge flows through the region 170a than though the region 170b. To this end, in these embodiments, the control signal S4A can be made to have a larger voltage than the control signal S4B. The reverse situation can also be achieved. Thus, by controlling the conductance of the CCD regions 170a, 170b proximate to the storage/splitting gate 160, a "splitting ratio" of the adjustable charge splitter 150 can be modulated or adjusted.

As a result of differences in values of a characteristic (e.g., voltage) of the control signals S4A, S4B, different portions (i.e., a splitting ratio) of the input charge stored in storage/splitting gate 160 can be transferred to the first and second charge-collection-structure storage gates 166a, 166b. The spitting ratio is related to a difference in values of the characteristic of the control signals S4A and S4B. As described above, in some embodiments, the splitting ratio is proportional to a voltage difference between the control signals S4A and S4B.

In some other embodiments, duty cycle of the control signals S4A and S4B is the characteristic of the control signals, the value of which can be varied (i.e., the duty cycle of the control signal S4A can be different than the duty cycle of the control signal S4B) to control amounts of charge, which flow into the first and second charge-collection-structure storage gates 166a, 166b, respectively. In these embodiments, the splitting ratio is proportional to a duty cycle difference between the control signals S4A and S4B. In yet some other embodiments both voltages and duty cycles of the control signals S4A and S4B are characteristics of the control signals, the values of which can be varied to control amounts of charge, which flow into the first and second charge-collection-structure storage gates 166a, 166b, respectively. The control signals S1–S3, S4A, S4B, S5A, S5B, S6A, S6B are described more fully below in conjunction with FIG. 5.

In some electronic systems in which the adjustable charge splitter 150 is used, the adjustment is made statically, for example at time of manufacture, wherein the voltages and/or duty cycles of the control signals S4A, S4B are statically determined and set to compensate, for example, for manufacturing process variations. In other electronic systems in which the adjustable charge splitter 150 is used, the adjustment is made dynamically. For example, dynamic adjustment can be made once at power up of the system, wherein the system can measure an error associated with the splitting ratio and can adjust the voltages and/or duty cycles of the control signals S4A, S4B accordingly. For another example, dynamic adjustment can be made continually or at intervals when a system is operating, wherein the system can measure the error associated with the splitting ratio continuously or at the intervals and can adjust the voltages and/or duty cycles of the control signals S4A, S4B accordingly.

It should be appreciated that in preferred embodiments, the control signals S4A, S4B are separate and a value of a characteristic (e.g., voltage) of the control signals S4A, S4B is changed to adjust the splitting ratio of the adjustable charge splitter 150. The value of the characteristic of both of the control signals S4A, S4B should be stable when charge is transferred from the storage/splitting gate 160 to the first and second charge collection-structure storage gates 166a, 166b. If, for example, a transient voltage change (i.e., an edge) on the control signal S4A couples a voltage into the control signal S4B, this coupled voltage change can affect the resulting splitting ratio. Accordingly, it is preferable to change state of both of the control signals S4A and S4B at substantially the same time. It is also preferable to wait for an appropriate amount of time to pass after transitions of the control signals S4A and S4B before allowing charge to pass through the first and second barrier gates 164a, 164b. This delay can be achieved by manipulating the control signal S3.

There are a variety of variables that affect the 'gain' (defined as the splitting ratio divided by the difference in voltage and/or duty cycle of the control signals S4A, S4B) of the adjustment of the splitting ratio. Such variables include, but are not limited to, geometry of the adjustable charge splitter, the amount of input charge, the rate at which charge is transferred out of the storage/splitting gate 160, voltage levels of other control signals (S1–S3, S5A, S5B, S6A, S6B), and common-mode voltage of the control signals S4A, S4B.

It should be appreciated that in this exemplary embodiment the input channel 152 and the output channels 162a, 162b are disposed in a substantially Y-shaped arrangement. However, the input and output channels can be disposed such that they form other shapes including but not limited to a T-shape. It should also be appreciated that channels 162a, 162b begin to diverge from each other at a region 172 and that the geometry of the region 172 may take on many different shapes. For example, the channels 162a, 162b may meet at region 172 and form a corner having an acute angle, a right angle, an obtuse angle or they may form any one or a portion of a variety of different geometric shapes including but not limited to circular shapes, elliptical shapes, rectangular shapes, square shapes, triangular shapes and truncated triangular shapes.

Figure 4E:
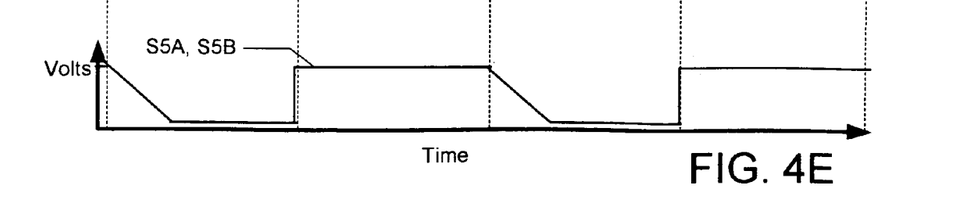

Referring now to FIGS. 4–4E, in which like control signals of FIG. 3 are shown having like reference designations, the control signals S1–S3, S4A, S4B, S5A, S5B are shown in conjunction with a respective horizontal scale in units of time and a respective vertical scale in units of voltage. The time scales each have the same time scaling, however, the voltage scales do not necessarily each have the same voltage scaling.

In some exemplary embodiments, the high state voltage value of the S1, S3, S5A and S5B control signals is approximately 3.3 volts and their low state voltage value is approximately 0.5 volts, the high state voltage value of the S2, S6A, and S6B control signals is approximately 1.5 volts and their low state voltage value is approximately 0.0 volts, and the high state voltage value of the S4A and S4B control signals is approximately 1.5 volts (not including a voltage difference) and their low state voltage value is approximately 0.0 volts.

The control signals shown correspond to a four-phase arrangement. However, other phase arrangements are also possible with this invention.

Electrical charge is transferred when a barrier gate control signal is high and a storage gate control signal transitions low. For example, when the control signal S2 associated with the input barrier gate 156 of FIG. 3 is high and S1, which is associated with the input storage gate 154 of FIG. 3 transitions low, charge is transferred from the input storage gate 154 to the storage/splitting gate 160 of FIG. 3.

In the same way as described above, when the control signal S4A, associated with the first barrier gate 164a of FIG. 3 is high, the control signal S4B, associated with the second barrier gate 164b of FIG. 3 is high, and the control signal S3, which is associated with the storage/splitting gate 160 of FIG. 3, transitions low, charge is transferred from the storage/splitting gate 160 to the first and second charge-collection-structure storage gates 166a and 166b of FIG. 3. In some embodiments, the amount of charge transferred to the first charge-collection-structure storage gate 166a versus the amount of charge transferred to the second charge-collection-structure storage gate 166b is related to a voltage difference between voltages VA (FIG. 4C) and VB (FIG. 4D).

In some embodiments, where the splitting ratio is not affected by other factors and would otherwise be 50:50, a control voltage value VA of $V_{common}-\Delta V$ and a control voltage value VB of $V_{common}+\Delta V$, where $\Delta V$ is several hundred millivolts, results in a splitting ratio of about 45:55. Exemplary voltage values, which may be used as voltages VA and VB are in the range of 1.0 volt to 1.4 volts, which can result in a splitting ratios of 0.45 to 0.55. However, it should be recognized that these voltages can be different for different geometries and fabrication processes.

Typical voltage values of the other control signals S1–S3, S5A, S5B, S6A, S6B are in the range of 0.0 volts to 3.3 volts. The voltages of the other control signals S1–S3, S5A, S5B, S6A, S6B may be the same or different voltages. Again, it should be recognized that these voltages can be different for different geometries and fabrication processes.

In one particular embodiment, timing of the control signals S4A, S4B is comparable. More precisely, both clocks should be in their final high state when the control signal S3 is turned off, i.e., transitions low. In this condition, charge is transferred from the storage/splitting gate 160 (FIG. 3) through the first and second barrier gates 164a, 164b (FIG. 3) and into the first and second charge-collection-structure storage gates 166a, 166b (FIG. 3). When each control signal S4A, S4B actually transitions high or low is generally unimportant, so long as both are high when the control signal S3 falls (goes low).

In other embodiments, the splitting ratio is controlled by duty cycles of the control signals S4A and S4B as typified by the signal S4A' shown in phantom lines. As described above, the duty cycle may be adjusted in combination with or separate from voltage control.

An adjustable CCD charge splitter having an arrangement of storage and barrier gates, which is different from the arrangement described herein above, may also be used.

The particular arrangement of storage and barrier gates to use in any particular application is selected in accordance with a variety of factors, including but not limited to, clocking strategy, functional application, manufacturing tolerances, geometrical limitations, charge capacity, and CTE (charge transfer efficiency) requirements.

In the description provided herein above, reference has been made to an exemplary embodiment of a charge coupled device (CCD) charge splitter, which includes a four-phase CCD having alternating storage and barrier gates. It should be appreciated, of course, that other embodiments may also be used without departing from the spirit of the invention. For example, a CCD charge splitter, which includes a CCD having fewer or more that four-phases may be used. For example, two, three, five, six or more phases may be used.

The particular number of phases to use in any particular application is selected in accordance with a variety of factors, including but not limited to, system design, available clocks signals, process technology used, and ease of chip layout.

While two output channels are shown and described in conjunction with some of the figures and examples above, it should be recognized that there can be a different number of output channels, for example, as shown in FIG. 1.

The adjustable charge splitters 50, 100, 150 of FIGS. 1, 2, and 3 can be used in a variety of applications. One such application is directed to analog to digital (A/D) converters, described below in conjunction with FIG. 5.

Figure 5:
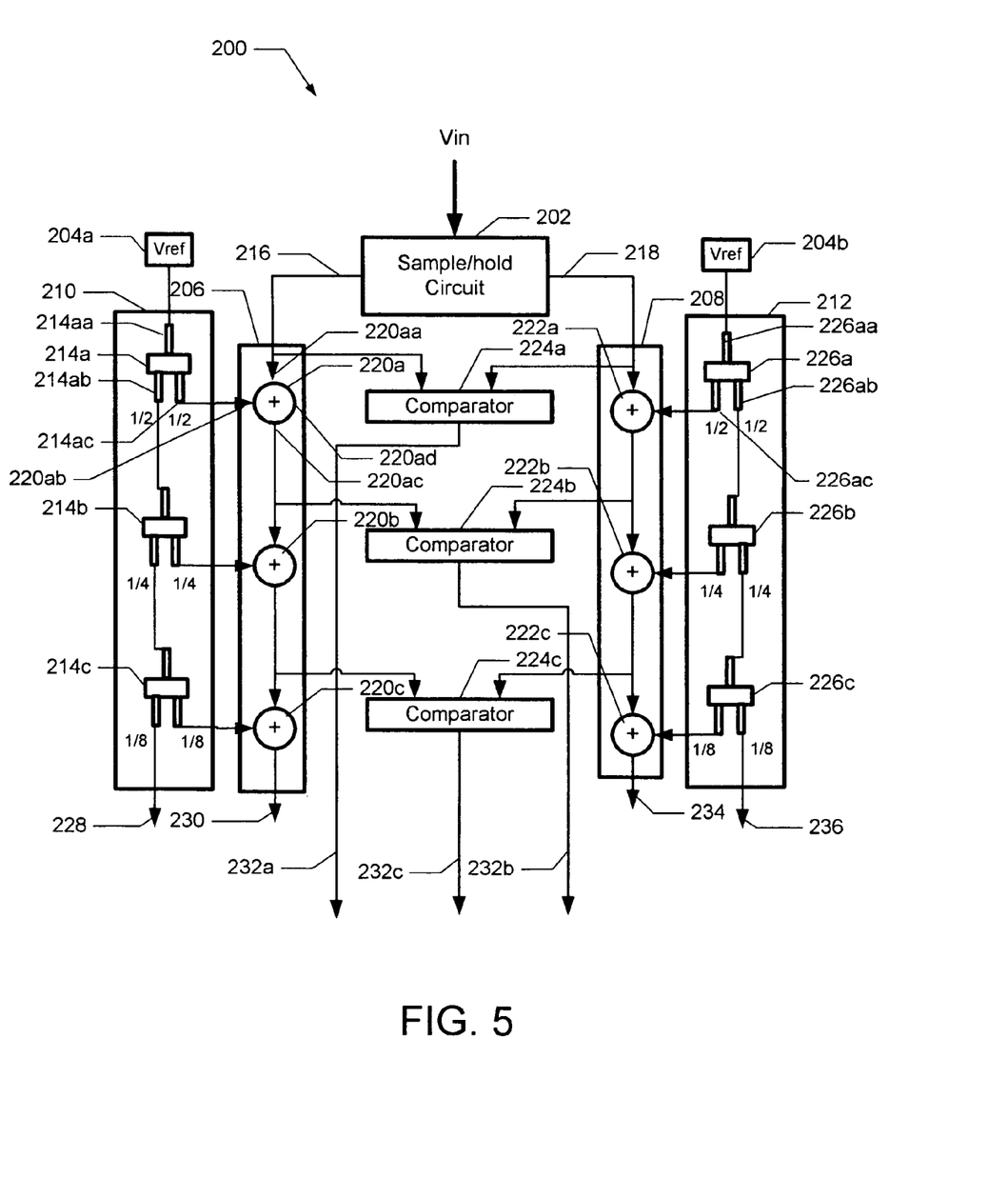
FIG. 5 is a block diagram of an exemplary circuit, here an analog-to-digital circuit (ADC), in which the adjustable charge coupled device (CCD) charge splitters of FIGS. 1–3 are used.

Referring now to FIG. 5, an analog-to-digital converter (ADC) 200 includes a sample/hold circuit 202, two signal channels 206 and 208, two scaling channels 210 and 212, and comparators 224a–224c. The signal channel 206 contains three conditional summation stages 220a–220c as does signal channel 208, which includes three conditional summation stages 222a–222c. The scaling channel 210 includes three adjustable charge splitters 214a–214c and the scaling channel 212 also contains three adjustable charge splitters 226a–226c.

The adjustable charge splitters 214a–214c, 226a–226c can be the same as or similar to the adjustable charge splitters 50, 100, 150 described above in conjunction with FIGS. 1–3, respectively.

Taking the adjustable charge splitter 214a as representative of the other adjustable charge splitters 214b, 214c, 226a–226c, the adjustable charge splitter 214a includes an input channel 214aa, and two output channels 214ab, 214ac. The input channel 214aa can be the same as or similar to the input channel 152 of FIG. 3 and the two output channels 214ab, 214ac can be the same as or similar to the first and second output channels 162a, 162b of FIG. 3. The adjustable charge splitter 214a is adjusted by the structures and techniques described above to provide a 50:50 split of charge provided to the input channels 214a, resulting in ½ and ½ of the input charge at the output channels 214ab, 214ac, respectively.

Taking the conditional summation stage 220a as representative of the other conditional summation stages 220b, 220c, 222a–222c, the conditional summation stage 220a includes two input ports 220aa, 220ab and an output port 220ac. A charge provided at the output port 220ac can be the same as the charge received at the input port 220aa, or it can instead be the sum of the charges received at the two input ports 220aa and 220ab, depending on the state of a control signal (not shown).

The ADC 200 described here includes three stages associated with the three comparators 224a–224c. However, it should be appreciated that any number of stages could be used. The number of stages used determines a resolution of the ADC 200.

The ADC 200 operates as follows. An input signal, $V_{in}$, is provided to the sample/hold circuitry 202, which generates a differential signal-charge pair 216 and 218. The difference between signal charges 216 and 218 is proportional to the sampled value of $V_{in}$. Signal charge 216 is provided to the signal channel 206 and signal charge 218 is provided to the signal channel 208. The charges in the signal channels 206, 208, ahead of conditional summation stages 220a, 222a respectively, are compared by the first comparator 224a. The decision of the comparator 224a results in a digital output 232a from this stage, and indicates which of the two signal charges is larger. Two nominally equal reference charges are provided by the adjustable charge splitters 214a, 226a at ports 214ac, 226ac. The state of the comparator output 232a directs the addition of the reference charge from either the adjustable charge splitter port 214ac or the adjustable charge splitter port 226ac to the smaller member of the signal-charge pair, i.e. it causes a summation at either the conditional summation stage 220a or 222a (i.e., the comparator output signal 232a controls the conditional summation stages 220a, 222a). The unused reference charge (e.g., at the port 214ac) is discarded. The charge pair resulting from these comparison and addition operations is provided to the next conditional summation stages 220b, 222b of the signal channels 206 and 208, respectively.

The operation is repeated, wherein the charges ahead of the conditional summation stages 220b, 222b are compared this time by the comparator 224b. The decision of the comparator 224b results in the digital output 232b from this stage, and indicates which of the two signal charges is larger. Two nominally equal reference charges are provided by the adjustable charge splitters 214b and 226b. The reference charges in these stages, in the preferred embodiment, are half the value of the reference charges of the previous stage. The state of the comparator output signal 232b directs the addition of the reference charge from either the adjustable charge splitter 214*b* or the adjustable charge splitter 226*b* to the smaller member of the signal-charge pair (i.e., the comparator output signal 232*b* controls the conditional summation stages 220*b*, 222*b*). The charge pair resulting from these comparison and addition operations is then fed to the next conditional summation stages 220*c* and 222*c* of the signal channels 206 and 208 respectively.

The operation is repeated again in the third stage, wherein the charges ahead of the respective conditional summation stages 220*c*, 222*c* are compared by the comparator 224*c*. The decision of the comparator 224*c* result is the digital output 232*c* from this stage, and indicates which of the two signal charges is larger. Two nominally equal reference charges are provided by the adjustable charge splitters 214*c* and 226*c*. The reference charges in this stage, in the preferred embodiment, are half the value of the reference charges of the previous stage. The state of the comparator output signal 232*c* directs the addition of the reference charge from either the adjustable charge splitter 214*c* or the adjustable charge splitter 226*c* to the smaller member of the signal-charge pair (i.e., the comparator output signal 232*c* controls the conditional summation stages 220*c*, 222*c*). The charge pair resulting from these comparison and addition operations is output from the ADC 202 at differential outputs 230, 234.

It should be understood that the adjustable charge splitters 214*a*–214*c*, 226*a*–226*c* can provide the ADC 200 with a better accuracy (e.g., linearity) than that which can be achieved with conventional non-adjustable charge splitters. The improved accuracy is achieve by adjusting the adjustable charge splitters 214*a*–14*c*, 226*a*–226*c* to have a more precise 50:50 splitting ratio than that which could generally be achieved without the adjustment.

It should be appreciated that reference herein to any single exemplary embodiment is made merely to promote clarity in the text and in the description of the inventive concepts contained herein.

Although only a few exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention as defined in the following claims. It should further be noted that any patents, applications, and publications referred to herein are incorporated by reference in their entirety.

What is claimed is:

1. A charge coupled device (CCD) charge splitter, comprising:
   an input channel;
   a plurality of output channels coupled to the input channel; and
   a channel control structure disposed over at least a portion of said input channel and a portion of at least two of said plurality of output channels, wherein said channel control structure is adapted to adjust respective amounts of charge flowing into the plurality of output channels in response to a control signal.

2. The charge coupled device (CCD) charge splitter of claim 1, wherein the channel control structure includes:
   a storage/splitting gate disposed over at least a portion of the input channel and coupled to receive a charge from the input channel; and
   a first barrier gate disposed over at least one of the plurality of output channels and coupled to pass a first portion of the charge from the storage/splitting gate.

3. The charge coupled device (CCD) charge splitter of claim 2, further including a first charge collection structure coupled to receive the first portion of the charge from the first barrier gate.

4. The charge coupled device (CCD) charge splitter of claim 3, wherein the first charge collection structure comprises:
   a first charge-collection-structure storage gate coupled to receive the first portion of the charge from the first barrier gate; and
   a first charge-collection-structure barrier gate coupled to pass the first portion of the charge from the first storage gate.

5. The charge coupled device (CCD) charge splitter of claim 3, wherein the first charge collection structure comprises a diffusion structure.

6. The charge coupled device (CCD) charge splitter of claim 5, wherein a voltage related to the first portion of the charge is available at the diffusion structure.

7. The charge coupled device (CCD) charge splitter of claim 2, further including a second barrier gate disposed over another at least one of the plurality of output channels and coupled to pass a second portion of the charge from the storage/splitting gate.

8. The charge coupled device (CCD) charge splitter of claim 7, wherein the first barrier gate is variably responsive to a first control signal applied to the first barrier gate and the second barrier gate is variably responsive to a second control signal applied to the second barrier gate, wherein a relationship between a value of a characteristic of the first control signal and a value of a characteristic of the second control signal determines a relationship between the first portion of the charge and the second portion of the charge.

9. The charge coupled device (CCD) charge splitter of claim 7, further including:
   a first charge collection structure coupled to receive the first portion of the charge from the first barrier gate; and
   a second charge collection structure coupled to receive the second portion of the charge from the second barrier gate.

10. The charge coupled device (CCD) charge splitter of claim 9, wherein the first charge collection structure comprises:
    a first charge-collection-structure storage gate coupled to receive the first portion of the charge from the first barrier gate; and
    a first charge-collection-structure barrier gate coupled to pass the first portion of the charge from the first storage gate, and wherein the second charge collection structure comprises:
    a second charge-collection-structure storage gate coupled to receive the second portion of the charge from the second barrier gate; and
    a second charge-collection-structure barrier gate coupled to pass the second portion of the charge from the second storage gate.

11. The charge coupled device (CCD) charge splitter of claim 10, further including:
    an input storage gate disposed over at least a portion of the input channel and coupled to receive a charge from the input channel; and
    an input barrier gate disposed over the input channel and coupled to pass the charge to the storage/splitting gate.

12. A method of splitting charge in a charge coupled device (CCD) having an input channel, a plurality of output channels, and a channel control structure disposed over at least a portion of the input channel and a portion of at least two of the plurality of output channels, the method comprising:

receiving a charge at the input channel;

transferring the charge to the channel control structure; and applying one or more control signals to the channel control structure, wherein the channel control structure is adapted to adjust respective amounts of charge flowing into the plurality of output channels in response to the one or more control signals.

13. The method of claim 12, wherein the channel control structure includes:

a storage/splitting gate disposed over at least a portion of the input channel and coupled to receive the charge from the input channel; and a first barrier gate disposed over at least one of the plurality of output channels and coupled to pass a first portion of the charge from the storage/splitting gate in response to the one or more control signals.

14. The method of claim 13, further including receiving one of the amounts of charge with a first charge collection structure coupled to receive the first portion of the charge from the first barrier gate.

15. The method of claim 14, wherein the first charge collection structure comprises:

a first storage gate coupled to receive the first portion of the charge from the first barrier gate; and a first charge-collection-structure barrier gate coupled to pass the first portion of the charge from the first storage gate.

16. The method of claim 14, wherein the first charge collection structure comprises a providing diffusion structure.

17. The method of claim 16, wherein a voltage related to the first portion of the charge is available at the diffusion structure.

18. The method of claim 13, wherein the charge control structure further includes a second barrier gate disposed over another at least one of the plurality of output channels and coupled to pass a second portion of the charge from the storage/splitting gate.

19. The method of claim 18, further including:

receiving one of the amounts of charge with a first charge collection structure coupled to the first barrier gate; and receiving another one of the amounts of charge with a second charge collection structure coupled to the second barrier gate.

20. The method of claim 19, wherein the first charge collection structure comprises:

a first charge-collection-structure storage gate coupled to receive the first portion of the charge from the first barrier gate; and a first charge-collection-structure barrier gate coupled to pass the first portion of the charge from the first storage gate, and wherein the second charge collection structure comprises:

a second charge-collection-structure storage gate coupled to receive the second portion of the charge from the second barrier gate; and a second charge-collection-structure barrier gate coupled to pass the second portion of the charge from the second storage gate.

21. A charge splitting apparatus for splitting an input charge in a charge coupled device (CCD), comprising:

a channel, coupled to receive and carry the input charge through the CCD;

a first and a second charge collection structure; and a controller, for controlling a split of the input charge so that portions of the input charge are fed, respectively, to the first and second charge collection structures.

22. An apparatus as in claim 21, wherein the controller is additionally responsive to a split proportion control signal, such that amount of input charge fed to the first and second charge collection structures is in accordance with parameters of the split proportion input signal.

23. An apparatus as in claim 21, wherein the controller is coupled to the channel such that the input charge is split while being carried in the channel.

24. An apparatus as in claim 23, additionally comprising:

one or more barrier gates, positioned adjacent the channel, for controlling the split of the input charge.

25. An apparatus as in claim 24, wherein the controller additionally applies a clock signal to at least one of the barrier gates for controlling the split.

26. An apparatus as in claim 24, additionally comprising:

one or more holding gates, positioned adjacent the channel prior to the one or more barrier gates, so that the split of the input charge occurs while charge is exiting the holding gates.

27. A charge coupled device (CCD) apparatus for dividing an input charge packet into a plurality of output charge packets comprising:

a receiver, coupled to receive and carry input charge packets through the apparatus;

at least two charge collection structures; and a controller, responsive to an input signal, for controlling portions of the input charge that are fed to each of the charge collection structures, in accordance with parameters of input signals.

28. An apparatus as in claim 27 wherein the controller is arranged such that the input charge is proportioned among the charge collection structures while being carried into the collection structures.

29. An apparatus as in claim 27 additionally comprising one or more barrier gates, for controlling the division of the input charge.

30. An apparatus as in claim 28 wherein the controller additionally applies a clock signal to at least one of the barrier gates for controlling the division of the input charge.

31. An apparatus as in claim 28 additionally comprising one or more holding gates, positioned adjacent to the barrier gate(s), so that the division of the input charge occurs while charge is exiting the holding gate(s).

32. An apparatus as in claim 31 wherein the holding gate forms part of the receiver.

* * * * *

UNITED STATES PATENT AND TRADEMARK OFFICE
CERTIFICATE OF CORRECTION

| | | |
|---|---|---|
| PATENT NO. | : 7,154,134 B2 | Page 1 of 1 |
| APPLICATION NO. | : 11/177153 | |
| DATED | : December 26, 2006 | |
| INVENTOR(S) | : Anthony et al. | |

It is certified that error appears in the above-identified patent and that said Letters Patent is hereby corrected as shown below:

Column 1, lines 32-33 delete "nondestructively" and replace with --non-destructively--.

Column 3, line 37 delete "controls portions" and replace with --control portions--.

Column 3, line 61 delete "particular size shape and" and replace with --particular size, shape and--.

Column 6, line 59 delete "than though" and replace with --than through--.

Column 7, line 4 delete "spitting" and replace with --splitting--.

Column 7, line 18 delete "embodiments both" and replace with --embodiments, both--.

Column 7, line 55 delete "change state" and replace with --change the state--.

Column 8, lines 4-5 delete "embodiment the input" and replace with --embodiment, the input--.

Column 9, line 1 delete "splitting ratios" and replace with --splitting ratio--.

Column 9, line 47 delete "clocks signal," and replace with --clock signals,--.

Column 9, line 55 delete "analog to digital" and replace with --analog-to-digital--.

Signed and Sealed this

Twenty-sixth Day of June, 2007

JON W. DUDAS
*Director of the United States Patent and Trademark Office*